United States Patent
Sasaki

(10) Patent No.: US 8,270,247 B2
(45) Date of Patent: Sep. 18, 2012

(54) WORD LINE DRIVING CIRCUIT AND SEMICONDUCTOR STORAGE DEVICE

(75) Inventor: Takahiko Sasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 186 days.

(21) Appl. No.: 12/885,305

(22) Filed: Sep. 17, 2010

(65) Prior Publication Data

US 2011/0158029 A1 Jun. 30, 2011

(30) Foreign Application Priority Data

Dec. 25, 2009 (JP) ................ 2009-296421

(51) Int. Cl.
*G11C 8/08* (2006.01)
(52) U.S. Cl. ................ 365/230.06; 365/194
(58) Field of Classification Search ............ 365/230.06, 365/194
See application file for complete search history.

(56) References Cited

U.S. PATENT DOCUMENTS

| | | | | |
|---|---|---|---|---|
| 5,253,204 A | * | 10/1993 | Hatakeyama et al. | 365/189.06 |
| 5,504,715 A | * | 4/1996 | Lee et al. | 365/230.06 |
| 5,903,498 A | * | 5/1999 | Campardo et al. | 365/185.23 |
| 7,403,418 B2 | * | 7/2008 | Lin et al. | 365/185.11 |
| 2002/0159296 A1 | | 10/2002 | Akaogi | |

FOREIGN PATENT DOCUMENTS

| | | |
|---|---|---|
| JP | H08-255486 A | 1/1996 |
| JP | H08-306198 A | 11/1996 |
| JP | H11-306783 A | 11/1999 |
| JP | 2000-021179 A | 1/2000 |
| JP | 2000-285680 A | 10/2000 |
| JP | 2003-068091 A | 3/2003 |
| JP | 2003-517694 A | 5/2003 |
| JP | 2003-281893 A | 10/2003 |
| JP | 2007-323808 A | 12/2007 |
| JP | 2008-021371 A | 1/2008 |
| WO | WO 00/46807 A1 | 8/2000 |

OTHER PUBLICATIONS

M. Iijima et al., "Ultra Low Voltage Operation with Bootstrap Scheme for Single Power Supply SOI-SRAM," VLSI 2007.
Background Art Information in 1 page.
Prior Art Information List in 1 page.

* cited by examiner

*Primary Examiner* — Anh Phung
(74) *Attorney, Agent, or Firm* — Knobbe, Martens, Olson & Bear, LLP

(57) ABSTRACT

According to one embodiment, a word line driving circuit includes a driver and a booster circuit. The driver drives a word line based on an output of an inverter. The booster circuit connects a boosting capacitor to a source side of a P-channel field effect transistor of the inverter to boost the potential of the word line.

20 Claims, 4 Drawing Sheets

WORD LINE DRIVING CIRCUIT AND SEMICONDUCTOR STORAGE DEVICE

CROSS-REFERENCE TO RELATED APPLICATIONS

This application is based upon and claims the benefit of priority from the prior Japanese Patent Application No. 2009-296421, filed on Dec. 25, 2009; the entire contents of which are incorporated herein by reference.

FIELD

Embodiments described herein relate generally to a word line driving circuit and a semiconductor storage device.

BACKGROUND

To compensate for a decrease in an operation margin involved in a fall in power supply voltage of an SRAM, driving voltage for driving a word line is boosted in the inside (Ultra Low Voltage Operation with Bootstrap Scheme for Single Power Supply SOI-SRAM, Iijima, M. et al. VLSI Design, 2007. 609-614).

DETAILED DESCRIPTION

In general, according to one embodiment, a word line driving circuit includes a driver and a booster circuit. The driver drives a word line based on an output of an inverter. The booster circuit connects a boosting capacitor to a source side of a P-channel field effect transistor of the inverter to boost the potential of the word line.

Exemplary embodiments of a word line driving circuit will be explained below in detail with reference to the accompanying drawings. The present invention is not limited to the following embodiments.

Figure 1:
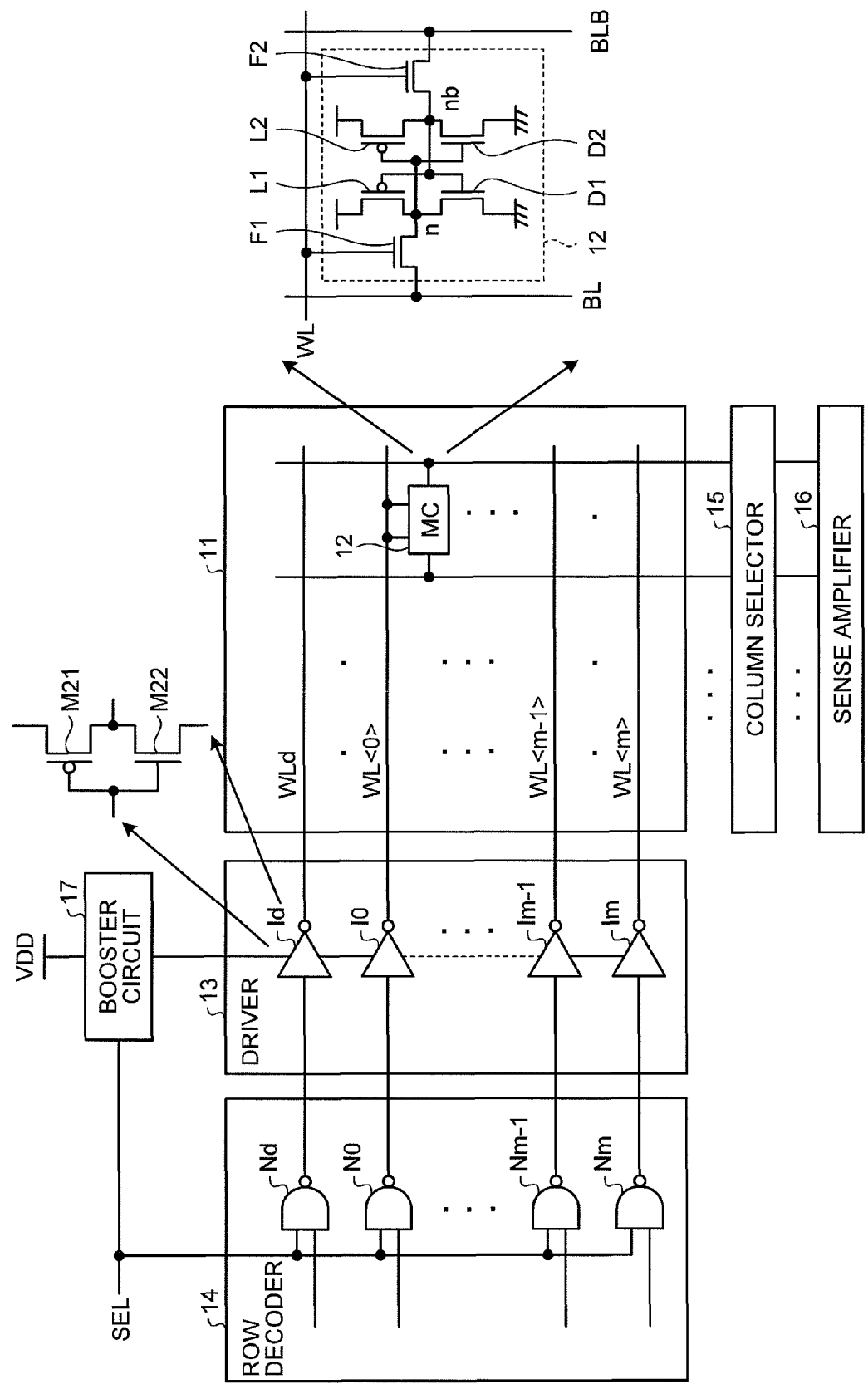
FIG. 1 is a block diagram of a schematic configuration of a semiconductor storage device to which a word line driving circuit according to a first embodiment of the present invention is applied.

FIG. 1 is a block diagram of a schematic configuration of a semiconductor storage device to which a word line driving circuit according to a first embodiment of the present invention is applied.

In FIG. 1, the semiconductor storage device includes a memory cell array 11, a driver 13, a row decoder 14, a column selector 15, a sense amplifier 16, and a booster circuit 17.

In the memory cell array 11, memory cells 12 are arrayed in a matrix shape in a row direction and a column direction. The memory cell array 11 includes word lines WL<0> to WL<m> (m is an integer equal to or larger than 2) that perform row selection for the memory cells 12 and a dummy word line WLd. The dummy word line WLd can be configured the same as the word lines WL<0> to WL<m>.

Each of the memory cells 12 includes a pair of driving transistors D1 and D2, a pair of load transistors L1 and L2, and a pair of transfer transistors F1 and F2. As the load transistors L1 and L2, a P-channel field effect transistor can be used. As the driving transistors D1 and D2 and the transfer transistors F1 and F2, an N-channel field effect transistor can be used.

The driving transistor D1 and the load transistor L1 are connected in series to each other to configure a CMOS inverter. The driving transistor D2 and the load transistor L2 are connected in series to each other to configure a CMOS inverter. Outputs and inputs of these pair of CMOS inverters are cross-coupled to each other to configure a flip-flop. Any one word line WL among the word lines WL<0> to WL<m> is connected to gates of the transfer transistors F1 and F2.

A bit line BL is connected to a gate of the driving transistor D2, a gate of the load transistor L2, a drain of the driving transistor D1, and a drain of the load transistor L1 via the transfer transistor F1. A bit line BLB is connected to a drain of the driving transistor D2, a drain of the load transistor L2, a gate of the driving transistor D1, and a gate of the load transistor L1 via the transfer transistor F2.

A connection point of the drain of the driving transistor D1 and the drain of the load transistor L1 can configure a storage node n. A connection point of the drain of the driving transistor D2 and the drain of the load transistor L2 can configure a storage node nb.

The driver 13 can separately drive the word lines WL<0> to WL<m> and the dummy word line WLd. The driver 13 can include inverters I0 to Im and Id respectively provided for the word lines WL<0> to WL<m>. Each of the inverters I0 to Im includes a P-channel field effect transistor M21 and an N-channel field effect transistor M22. The P-channel field effect transistor M21 and the N-channel field effect transistor M22 are connected in series to each other. A drain of the P-channel field effect transistor M21 and a drain of the N-channel field effect transistor M22 are connected to the word line WL. A gate of the P-channel field effect transistor M21 and a gate of the N-channel field effect transistor M22 are connected in common.

The row decoder 14 selects the word lines WL<0> to WL<m> or the dummy word line WLd that the row decoder 14 causes to perform, based on a row address, row selection for the memory cell array 11. The row decoder 14 can cause the driver 13 to drive the selected word lines WL<0> to WL<m> or the dummy word line WLd.

The column selector 15 can select the bit lines BL and BLB that the column selector 15 causes to perform column selection for the memory cell array 11. The sense amplifier 16 can detect, based on a signal read out from the memory cell 12 onto the bit lines BL and BLB, data stored in the memory cell 12.

The booster circuit 17 can boost, according to timing determined by a word line enable signal SEL, the potential of the word lines WL<0> to WL<m> and the dummy word line WLd to a value larger than power supply potential VDD. The booster circuit 17 includes a boosting capacitor that boosts the potential of the word lines WL<0> to WL<m> and the dummy word line WLd. The boosting capacitor is connected to a source of the P-channel field effect transistor M21 included in each of the inverters I0 to Im and Id. The boosting capacitor of the booster circuit 17 can be shared by the inverters I0 to Im and Id. For example, one boosting capacitor can share thirty-two word lines WL<0> to WL<m>. One boosting capacitor can be shared by sixteen word lines WL<0> to WL<m>.

NAND circuits N0 to Nm and Nd are respectively connected to pre-stages of the inverters I0 to Im and Id. The word line enable signal SEL is input to one input terminals of the NAND circuits N0 to Nm and Nd. A word line selection signal for selecting the word lines WL<0> to WL<m> or the dummy word line WLd is input to the other input terminals of the NAND circuits N0 to Nm and Nd.

When data is read out from a selected cell, the bit lines BL and BLB are pre-charged, and the column selector 15 performs column selection. The row decoder 14 performs row selection according to a rising edge of the word line enable signal SEL. The driver 13 drives the word lines WL<0> to WL<m> or the dummy word line WLd selected by the row decoder 14. The source of the P-channel field effect transistor M21 included in each of the inverters I0 to Im and Id is connected to the power supply potential VDD, whereby the potential of the word lines WL<0> to WL<m> or the dummy word line WLd is raised to the power supply potential VDD and charges are accumulated in the boosting capacitor.

When a predetermined time elapses from the rising edge of the word line enable signal SEL, the booster circuit 17 separates the source of the P-channel field effect transistor M21 included in each of the inverters I0 to Im and Id from the power supply potential VDD and connects the source to the boosting capacitor. The booster circuit 17 boosts the potential of the word line WL<0> to WL<m> or the dummy word line WLd to a value larger than the power supply potential VDD via the boosting capacitor.

When the potential of the word lines WL<0> to WL<m> or the dummy word line WLd is boosted, the transfer transistors F1 and F2 enter a saturation region and the storage nodes n an nb conduct to the bit lines BL and BLB. When the storage nodes n and nb conduct to the bit lines BL and BLB, the potential of the bit lines BL and BLB changes according to the potential of the storage nodes n and nb. The sense amplifier 16 detects the data stored in the selected cell.

Figure 2:
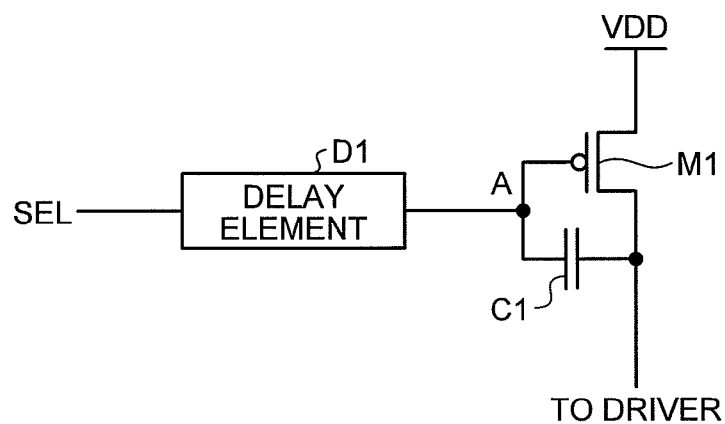
FIG. 2 is a block diagram of a schematic configuration of a booster circuit of the word line driving circuit according to the first embodiment of the present invention.

FIG. 2 is a block diagram of a schematic configuration of the booster circuit of the word line driving circuit according to the first embodiment of the present invention.

In FIG. 2, the booster circuit 17 shown in FIG. 1 includes a P-channel field effect transistor M1, a boosting capacitor C1, and a delay element D1. A source of the P-channel field effect transistor M1 is connected to the power supply potential VDD. A drain of the P-channel field effect transistor M1 is connected to the source of the P-channel field effect transistor M21 included in each of the inverters I0 to Im and Id shown in FIG. 1. The boosting capacitor C1 is connected between a gate of the P-channel field effect transistor M1 and the drain of the P-channel field effect transistor M1. The word line enable signal SEL is input to a connection point A of the gate of the P-channel field effect transistor M1 and the boosting capacitor C1 via the delay element D1.

Figure 3:
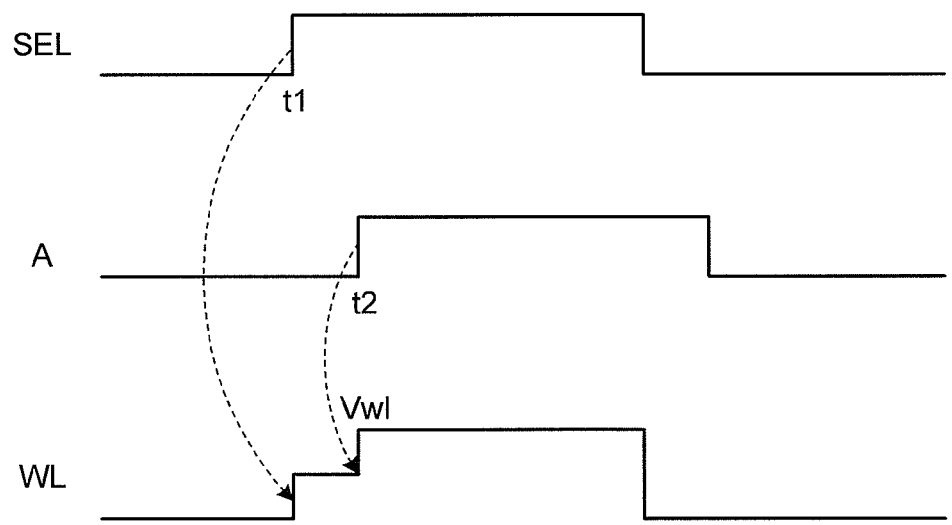
FIG. 3 is a timing chart of waveforms of sections of the word line driving circuit according to the first embodiment of the present invention.

FIG. 3 is a timing chart of waveforms of sections of the word line driving circuit according to the first embodiment of the present invention.

In FIG. 3, before the word line enable signal SEL rises, the P-channel field effect transistor M1 is turned on. The power supply potential VDD is supplied to the sources of the P-channel field effect transistors M21 of the inverters I0 to Im and Id shown in FIG. 1. The power supply potential VDD is applied to the boosting capacitor C1 and charges corresponding to the power supply potential VDD are accumulated in the boosting capacitor C1.

When the word line enable signal SEL rises, the P-channel field effect transistor M21 of any one of the inverters I0 to Im and Id in a row selected by the row decoder 14 shown in FIG. 1 is turned on and the potential of the word line WL in a row selected by the row decoder 14 is raised to the power supply potential VDD (time t1).

When a delay time by the delay element D1 elapses from the rising edge of the word line enable signal SEL, the potential at the connection point A of the gate of the P-channel field effect transistor M1 and the boosting capacitor C1 rises (time t2) and the P-channel field effect transistor M1 is turned off. Then, the word line WL in the row selected by the row decoder 14 is driven via the boosting capacitor C1. The potential Vwl of the word line WL is boosted to a value larger than the power supply potential VDD.

The potential Vwl of the word line WL after the boosting can be given by the following Formula (1) when a capacitance value of the word line WL is represented as Cwl and a capacitance value of the boosting capacitor C1 is represented as C1:

$$Vwl=(1+Cwl/(Cwl+C1))*VDD \qquad (1)$$

The P-channel field effect transistor M1 and the boosting capacitor C1 are connected to the sources of the P-channel field effect transistors M21 of the inverters I0 to Im and Id. Therefore, it is possible to boost the word lines WL<0> to WL<m> and the dummy word line WLd without changing the structure of the word line WL<0> to WL<m> and the dummy word line WLd. The P-channel field effect transistor M1 and the boosting capacitor C1 can be shared by the word lines WL<0> to WL<m> and the dummy word line WLd. It is possible to suppress an increase in a chip area.

Figure 4:
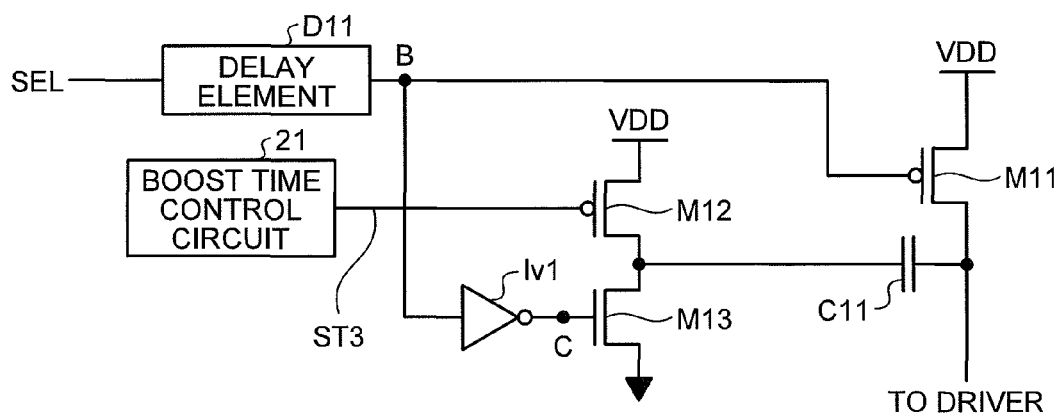
FIG. 4 is a block diagram of a schematic configuration of a booster circuit of a word line driving circuit according to a second embodiment of the present invention.

FIG. 4 is a block diagram of a schematic configuration of a booster circuit of a word line driving circuit according to a second embodiment of the present invention.

In FIG. 4, the booster circuit includes P-channel field effect transistors M11 and M12, an N-channel field effect transistor M13, a boosting capacitor C11, a delay element D11, an inverter IV1, and a boost time control circuit 21. A source of the P-channel field effect transistor M11 are connected to the power supply potential VDD. A drain of the P-channel field effect transistor M11 can be connected to the source of the P-channel field effect transistors M21 included in each of the inverters I0 to Im and Id shown in FIG. 1. The P-channel field effect transistor M12 and the N-channel field effect transistor M13 are connected in series to each other. A source of the P-channel field effect transistor M12 is connected to the power supply potential VDD. A boosting capacitor C11 is connected between the drain of the P-channel field effect transistor M11 and a drain of the P-channel field effect transistor M12. The word line enable signal SEL is input to a gate of the N-channel field effect transistor M13 sequentially via the delay element D11 and the inverter IV1. The word line enable signal SEL is input to a gate of the P-channel field effect transistor M11 via the delay element D11. A boost instruction signal ST3 is input to a gate of the P-channel field effect transistor M12 from the boost time control circuit 21. The boost time control circuit 21 can control, based on a charge amount accumulated in the dummy word line WLd shown in FIG. 1, boost time for boosting the word line WL.

Figure 5:
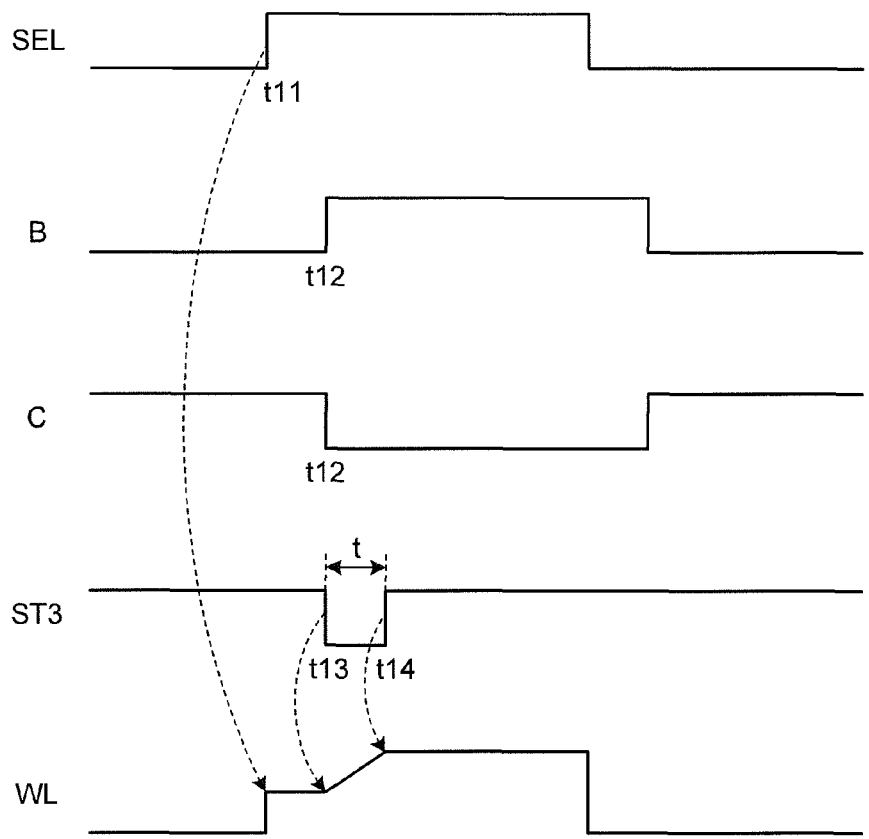
FIG. 5 is a timing chart of waveforms of sections of the word line driving circuit according to the second embodiment of the present invention.

FIG. 5 is a timing chart of waveforms of sections of the word line driving circuit according to the second embodiment of the present invention.

In FIG. 5, before the word line enable signal SEL rises, the P-channel field effect transistor M11 and the N-channel field effect transistor M13 are turned on. The power supply potential VDD is supplied to the sources of the P-channel field effect transistors M21 of the inverters I0 to Im and Id shown in FIG. 1. The power supply potential VDD is applied to the boosting capacitor C11 and charges corresponding to the power supply potential VDD are accumulated in the boosting capacitor C11.

When the word line enable signal SEL rises, the P-channel field effect transistor M21 of any one of the inverters I0 to Im and Id in a row selected by the row decoder 14 shown in FIG. 1 is turned on and the potential of the word line WL in a row selected by the row decoder 14 is raised to the power supply potential VDD (time t11).

When a delay time by the delay element D11 elapses from the rising edge of the word line enable signal SEL, a gate potential (the potential at a B point) of the P-channel field effect transistor M11 rises and a gate potential (the potential at a C point) of the N-channel field effect transistor M13 falls (time t12). The P-channel field effect transistor M11 and the N-channel field effect transistor M13 are turned off.

When the boost instruction signal ST3 falls (time t13), the P-channel field effect transistor M12 is turned on and the word line WL in a row selected by the row decoder 14 is driven via the boosting capacitor C11, whereby the potential Vwl of the word line WL is boosted to a value larger than the power supply potential VDD.

When the boost instruction signal ST3 falls (time t14), the P-channel field effect transistor M12 is turned off and the potential Vwl of the word line WL is maintained at a fixed value after the boosting.

Figure 6:
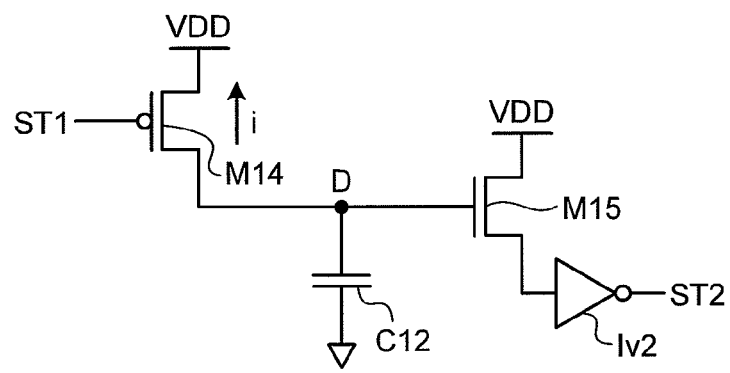
FIG. 6 is a circuit diagram of a schematic configuration of a boost time generating circuit shown in FIG. 4.

FIG. 6 is a circuit diagram of a schematic configuration of the boost time generating circuit shown in FIG. 4.

In FIG. 6, the boost time generation circuit 21 includes a p-channel field effect transistor M14, an N-channel field effect transistor M15, a dummy capacitor C12, and an inverter IV2. A source of the P-channel field effect transistor M14 is connected to the power supply potential VDD. A drain of the P-channel field effect transistor M14 is connected to one end of the dummy capacitor C12 and a gate of the N-channel field effect transistor M15. A drain of the N-channel field effect transistor M15 is connected to the power supply potential VDD. A source of the N-channel field effect transistor M15 is connected to an input terminal of the inverter IV2. A boost start signal ST1 is input to a gate of the P-channel field effect transistor M14. As the dummy capacitor C12, in addition to the capacitance of the dummy word line WLd shown in FIG. 1, the capacitance of a transistor incidental to the word line WL can be used. The capacitance of the transistor accompanying the word line WL is, for example, junction capacitance of an unselected plurality of word line drivers. The junction capacitance is, for example, junction capacitance on the source side of the P-channel field effect transistor M21 shown in FIG. 1.

Figure 7:
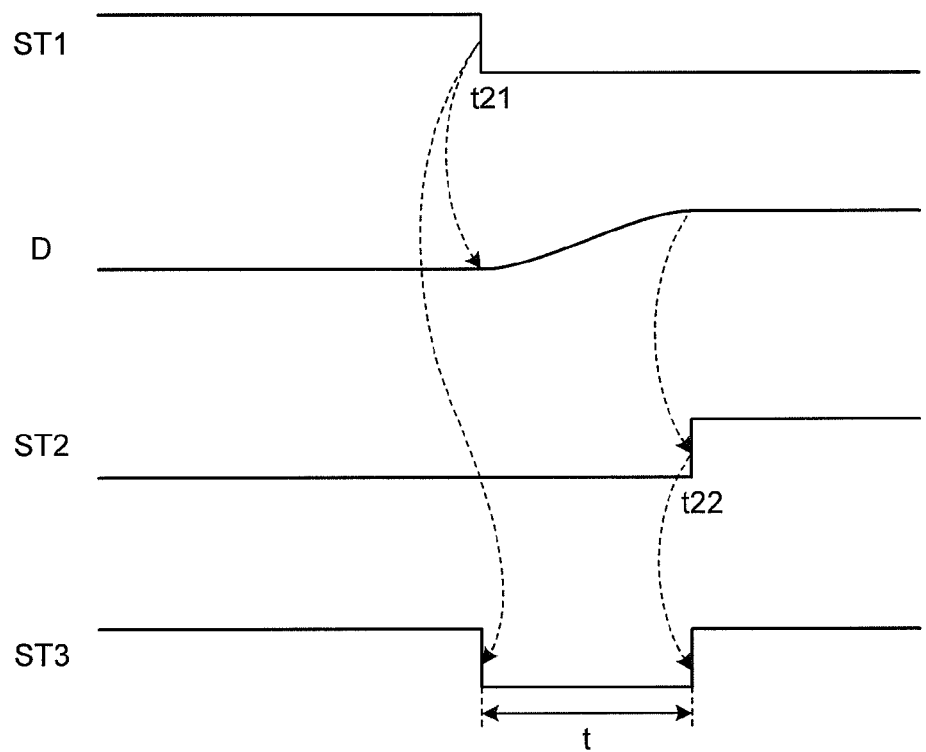
FIG. 7 is a timing chart of waveforms of sections of the boost time generating circuit shown in FIG. 4.

FIG. 7 is a timing chart of waveforms of sections of the boost time generating circuit shown in FIG. 4.

In FIG. 7, when the boost start signal ST1 rises (time t21), the P-channel field effect transistor M14 is turned on and the dummy capacitor C12 is charged according to electric current i flowing to the P-channel field effect transistor M14, whereby the potential at a D point rises. When the potential at the D point reaches a threshold of the N-channel field effect transistor M15 (time t22), the N-channel field effect transistor M15 is turned on and a boost end signal ST2 rises. A boost instruction signal ST3 is generated from the boost start signal ST1 and the boost end signal ST2 and input to the gate of the N-channel field effect transistor M12 shown in FIG. 4.

The potential Vwl of the word line WL after the boosting can be given by the following Formula (2) when a capacitance value of the word line WL is represented as Cwl, a charge amount accumulated in the word line WL is represented as q, electric current flowing to the P-channel field effect transistor M14 is represented as i, and time from a falling edge of the boost start signal ST1 to a rising edge of the boost end signal ST2 is represented as t:

$$Vwl=(q+i*t)/Cwl=VDD+i*t/Cwl \quad (2)$$

From Formula (2), the potential Vwl of the word line WL after the boosting can be set to not depend on a value of the boosting capacitor C11 shown in FIG. 4. Therefore, even when a value of the boosting capacitor C11 fluctuates in a direction different from a capacitance value of the word line WL, it is possible to suppress a boost level of the word line WL from fluctuating.

When a threshold of the N-channel field effect transistor M12 is represented as Vthn and a value of the dummy capacity C12 is represented as Cd, the time t from the falling edge of the boost start signal ST1 to the rising edge of the boost end signal ST2 can be given by the following Formula (3):

$$t=Vthn*Cd/1 \quad (3)$$

When the capacitance of the dummy word line WLd is used as the dummy capacitor C12 and the capacitance of the dummy word line WLd is equal to the capacitance of the word line WL, the time t from the falling edge of the boost start signal ST1 to the rising edge of the boost end signal ST2 can be given by the following Formula (4):

$$t=Vthn*Cwl/i \quad (4)$$

From Formula (4), the time t can be set to depend on the capacitance of the word line WL. It is possible to set a boost level of the word line WL without depending on the length of the word line WL.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A word line driving circuit comprising:
a driver configured to drive a word line based on an output of an inverter; and
a booster circuit comprising a boosting capacitor having a first and a second end, wherein
the boosting capacitor is electrically connected to a source side of a P-channel field effect transistor of the inverter, and
the boosting circuit is configured to increase a potential at the second end of the boosting capacitor to boost a potential of the word line.

2. The word line driving circuit according to claim 1, wherein the booster circuit is configured to increase the potential at the second end of the boosting capacitor after the potential of the word line is raised to a power supply voltage.

3. A word line driving circuit comprising:
a driver configured to drive a word line based on an output of an inverter; and a boosting capacitor connected to a source side of a P-channel field effect transistor of the inverter; and a first transistor that separates the source side of the P-channel field effect transistor of the inverter and a power supply potential.

4. The word line driving circuit according to claim 3, wherein the first transistor is configured to be turned on and the power supply potential is applied to the boosting capacitor and the source of the P-channel field effect transistor via the first transistor before a word line enable signal rises.

5. The word line driving circuit according to claim 3, wherein the P-channel field effect transistor is configured to be turned on and the power supply potential is applied to the word line when a word line enable signal rises.

6. The word line driving circuit according to claim 5, wherein the P-channel field effect transistor is configured to be turned off and a potential of the word line is boosted to a value larger than the power supply potential via the boosting capacitor when a delay time elapses from a rising edge of the word line enable signal.

7. The word line driving circuit according to claim 3, further comprising a plurality of drivers, each driver configured to drive a word line based on an output of an inverter, wherein the boosting capacitor and the first transistor are shared by the inverter provided for each word line.

8. The word line driving circuit according to claim 3, further comprising a boost time control circuit that controls a boost time for boosting the word line via the boosting capacitor.

9. The word line driving circuit according to claim 8, wherein the boost time control circuit controls the boost time for boosting the word line based on a charge amount accumulated in a dummy word line.

10. The word line driving circuit according to claim 9, wherein the boost time control circuit controls the boost time for boosting the word line based on a time from a beginning of an accumulation of charges in the dummy word line until a voltage potential of the dummy word line reaches a threshold of a second transistor.

11. A semiconductor storage device comprising:
    a memory cell array comprising memory cells in a matrix arrangement in a row direction and a column direction;
    one or more word lines configured to perform row selection for the memory cell array, each word line being configured to be driven by a driver, the driver being configured to drive the word line based on an output of an inverter;
    a row decoder configured to select a word line by causing the driver to drive the word line based on a row address;
    one or more bit lines configured to perform column selection for the memory cell array;
    a column selector configured to select a bit line;
    a sense amplifier configured to detect, based on a signal read out from a selected memory cell onto the bit line, data stored in the selected memory cell; and
    a booster circuit comprising a boosting capacitor having a first and a second end, the second end being electrically connected to a source side of a P-channel field effect transistor of the inverter, wherein the boosting circuit is configured to increase a potential at the second end of the boosting capacitor to boost a potential of the word line.

12. The semiconductor storage device according to claim 11, wherein the booster circuit is configured to increase the potential at the second end of the boosting capacitor after raising the potential of the word line to a power supply voltage.

13. The semiconductor storage device according to claim 11, wherein the booster circuit includes a first transistor that separates the source side of the P-channel field effect transistor of the inverter and a power supply potential.

14. The semiconductor storage device according to claim 13, wherein the first transistor is configured to be turned on and the power supply potential is applied to the boosting capacitor and the source of the P-channel field effect transistor via the first transistor before a word line enable signal rises.

15. The semiconductor storage device according to claim 13, wherein the P-channel field effect transistor of the inverter in a row selected by the row decoder is configured to be turned on and the power supply potential is applied to the word line in a row selected by the row decoder when a word line enable signal rises.

16. The semiconductor storage device according to claim 15, wherein the P-channel field effect transistor is configured to be turned off and the potential of the word line is boosted to a value larger than the power supply potential via the boosting capacitor when a delay time elapses from a rising edge of the word line enable signal.

17. The semiconductor storage device according to claim 13, wherein the boosting capacitor and the first transistor are shared by each inverter provided for the each word line.

18. The semiconductor storage device according to claim 13, further comprising a boost time control circuit that controls a boost time for boosting the word line via the boosting capacitor.

19. The semiconductor storage device according to claim 18, further comprising a dummy word line configured as one of the word lines, wherein
    the boost time control circuit controls the boost time for boosting the word line based on a charge amount accumulated in the dummy word line.

20. The semiconductor storage device according to claim 19, wherein the boost time control circuit controls the boost time for boosting the word line based on a time from a beginning of an accumulation of charges in the dummy word line until the potential of the dummy word line reaches a threshold of a second transistor.

* * * * *